United States Patent
Hars (10) Patent No.: US 6,771,104 B2
(45) Date of Patent: Aug. 3, 2004

(54) SWITCHING ELECTRONIC CIRCUIT FOR RANDOM NUMBER GENERATION

(75) Inventor: Laszlo Hars, Cortlandt Manor, NY (US)

(73) Assignee: Koninklijke Philips Electronics N.V., Eindhoven (NL)

(*) Notice: Subject to any disclaimer, the term of this patent is extended or adjusted under 35 U.S.C. 154(b) by 12 days.

(21) Appl. No.: 10/205,273

(22) Filed: Jul. 25, 2002

(65) Prior Publication Data

US 2004/0017235 A1 Jan. 29, 2004

(51) Int. Cl.[7] ................................................. H03K 3/84
(52) U.S. Cl. ....................... 327/164; 327/165; 327/166
(58) Field of Search ................................ 327/164, 165, 327/166, 172, 176; 331/78

(56) References Cited

U.S. PATENT DOCUMENTS

| | | | | |
|---|---|---|---|---|
| 3,866,128 A | * | 2/1975 | Fletcher et al. ............... 328/59 |
| 4,395,703 A | * | 7/1983 | Piosenka .................... 340/347 |
| 4,571,556 A | | 2/1986 | Gnerlich et al. .............. 331/78 |
| 4,810,975 A | * | 3/1989 | Dias ............................ 331/78 |
| 5,153,532 A | | 10/1992 | Albers et al. ................. 331/78 |
| 5,570,307 A | | 10/1996 | Takahashi .................... 364/717 |
| 5,596,617 A | | 1/1997 | Wolf et al. ................... 377/73 |
| 5,606,322 A | | 2/1997 | Allen et al. .................. 341/173 |
| 5,942,902 A | | 8/1999 | Okayasu ...................... 324/617 |
| 6,046,616 A | | 4/2000 | Chan et al. ................... 327/164 |
| 6,324,558 B1 | | 11/2001 | Wilber ......................... 708/255 |
| 6,480,072 B1 | * | 11/2002 | Walsh et al. .................. 331/78 |
| 2001/0005155 A1 | | 6/2001 | Smeets ........................ 327/164 |

FOREIGN PATENT DOCUMENTS

| | | |
|---|---|---|
| EP | 0 981 081 A2 | 2/2000 |
| EP | 1 075 084 A2 | 2/2001 |
| WO | WO 99/38069 | 7/1999 |
| WO | WO 01/61854 A1 | 8/2001 |

* cited by examiner

Primary Examiner—Tuan T. Lam
Assistant Examiner—Hiep Nguyen
(74) Attorney, Agent, or Firm—Kevin Simons (57) ABSTRACT

A physical random number generator has a bi-stable latch that operates to latch a random number bit in response to a reception of a voltage oscillating signal. When a switching device is in a first operating state, the bi-stable latch is deactivated and an oscillator is activated to generate one or more unpredictable voltage oscillation signals, which may provoke the bi-stable latch into a metastable state upon an activation of the bi-stable latch. When the switching device is in a second operating state, the oscillator is deactivated and the bi-stable latch is activated to latch a random number bit as a function of the unpredictable voltage oscillation signals, the randomness of the random number bit being enhanced by any provoking of the bi-stable latch into the metastable state by the voltage oscillating signal(s).

27 Claims, 7 Drawing Sheets

SWITCHING ELECTRONIC CIRCUIT FOR RANDOM NUMBER GENERATION

TECHNICAL FIELD

The present invention generally relates to physical random number generators (i.e., a device that generates a bit or bits representative of a number by operating one or more components of the device in an undeterminable manner). The present invention specifically relates to an operational efficiency of a physical random number generator that facilitates an incorporation of the physical random number generator within various types of electronic devices.

BACKGROUND AND SUMMARY OF THE INVENTION

Figure 1:
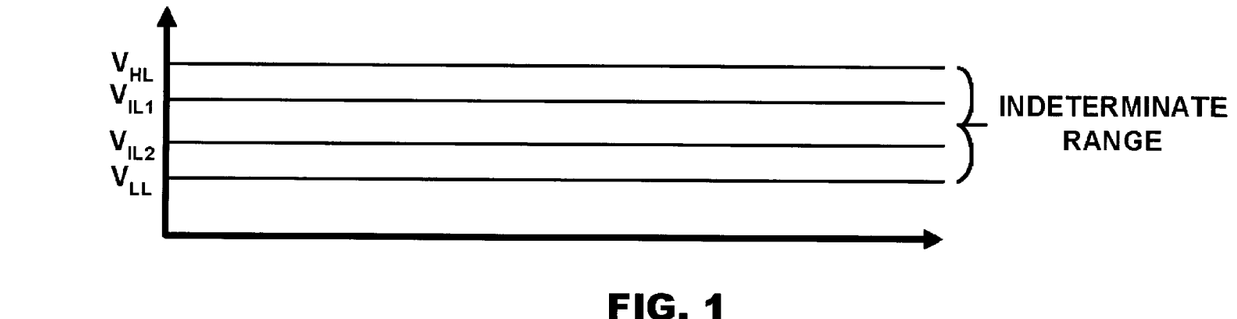
FIG. 1 illustrates a graphic view of a metastability principle of a bi-stable latch.

FIG. 1 illustrates one possible way to provoke a metastable state of a bi-stable latch via one or more inputs to the bi-stable latch. When a voltage level of each input of the bi-stable latch equals or exceeds a high logic voltage level $V_{HL}$, each output of the bi-stable latch can be pre-determined with a high degree of certainty (i.e., a stable state). Similarly, when a voltage level of each input of the bi-stable latch equals or is lower than a low logic voltage level $V_{LL}$, each output of the bi-stable latch can again be pre-determined with a high degree of certainty. Conversely, when a voltage level of any input of the bi-stable latch is between the high logic voltage level $V_{HL}$ and the low logic voltage level $V_{LL}$ (i.e., an indeterminate range), each output of the bi-stable latch can't be pre-determined with any degree of certainty (i.e., the metastable state).

The present invention provokes a metastable state of a bi-stable latch as a basis of a physical random number generator. Various aspects of the present invention are novel, non-obvious, and provide various advantages. While the actual nature of the present invention covered herein can only be determined with reference to the claims appended hereto, certain features, which are characteristic of the embodiments disclosed herein, are described briefly as follows.

One form of the present invention is a physical random number generator comprising an oscillator and a bi-stable latch, and a switch. When the bi-stable latch is deactivated, the oscillator is activated to provide one or more voltage oscillating signals, each voltage oscillating signal having an unpredictable logic voltage level. When the oscillator is deactivated, the bi-stable latch is activated to receive the voltage oscillation signal(s) and to latch a random number bit as a function of the unpredictable logic voltage level of each voltage oscillating signal at a time of reception of the voltage oscillating signal(s) by the bi-stable latch.

The foregoing form as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF THE PRESENT INVENTION

Figure 2:
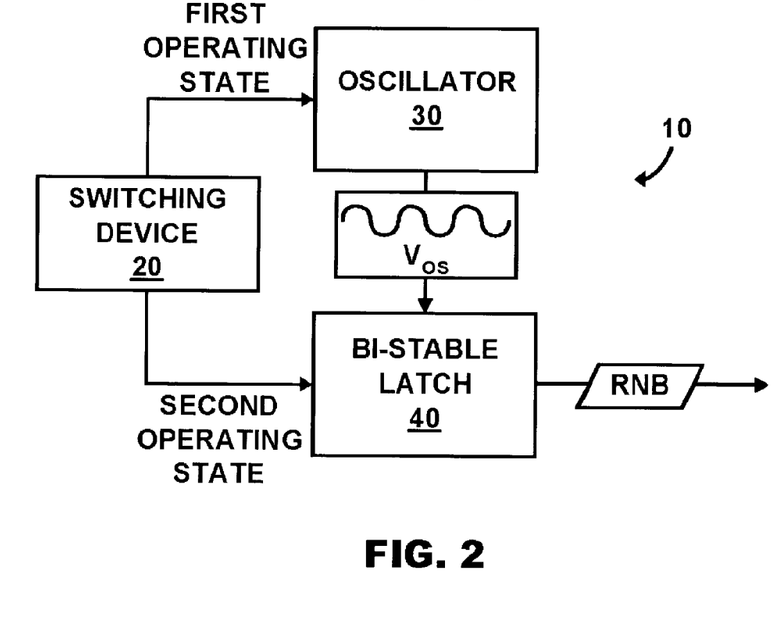
FIG. 2 illustrates a block diagram of a basic embodiment of a physical random number generator in accordance with the present invention.

FIG. 2 illustrates a physical random number generator 10 (hereinafter "PRNG 10") comprising a conventional switching device 20, a conventional oscillator 30, and a conventional bi-stable latch 40. A first operating state of the switching device 20 deactivates the bi-stable latch 40 and activates the oscillator 30 to provide a voltage oscillation signal $V_{OS}$ having an unpredictable logic voltage level as will be further described herein. A second operating state of the switching device 20 deactivates the oscillator 30 and activates the bi-stable latch 40 to receive voltage oscillation signal $V_{OS}$ and to latch a random number bit (RNB) as a function of the unpredictable logic voltage level of the voltage oscillation signal $V_{OS}$ at a time of reception of the voltage oscillation signal $V_{OS}$ by the bi-stable latch 40. Alternatively, when activated, the bi-stable latch 40 can receive a plurality of voltage oscillating signals $V_{OS}$ generated by the oscillator 30 to thereby latch the random number bit RNB as a function of the unpredictable logic voltage level of each voltage oscillating signal $V_{OS}$.

The randomness of a logic voltage level of the random number bit RNB as a zero (e.g., a low logic voltage level $V_{LL}$ as shown in FIG. 1) or a one (e.g., a high logic voltage level $V_{HL}$ as shown in FIG. 1) is influenced by internal noise of the oscillator 30 (e.g., phase noise, frequency drift or other types of noise as well known in the art) and/or by internal noise of the bi-stable latch 40 (e.g., thermal-junction-, shot- or other types of noise as well known in the art). Specifically, the internal noise of the oscillator 30 yields the unpredictable logic voltage level of the voltage oscillating signal $V_{OS}$. Ideally, when received by the bi-stable latch 40, the unpredictable logic voltage level of the voltage oscillating signal $V_{OS}$ is between the low logic voltage level $V_{LL}$ and the high logic voltage level $V_{HL}$ (i.e., an indeterminate range), such as, for example, between an indeterminate logic voltage level $V_{IL1}$ and an indeterminate logic voltage level $V_{IL2}$ as shown in FIG. 1. Under the ideal condition, a metastable state of the bi-stable latch 40 would be provoked by voltage oscillating signal $V_{OS}$, which results in a latching of the random number bit RNB with a logic voltage level reflective of a stabilization of the unpredictable logic voltage level of the voltage oscillating signal $V_{OS}$, after a delay, to the low logic voltage level $V_{LL}$ or to the high logic voltage level $V_{HL}$. If a metastable state of the bi-stable latch 40 is not provoked by the voltage oscillating signal $V_{OS}$ under the ideal condition or if the unpredictable logic voltage level of the voltage oscillating signal $V_{OS}$ is outside of the indeterminate range of the bi-stable latch 40, then the random number bit RNB will follow the unpredictable logic voltage level of the voltage oscillating signal $V_{OS}$ at the time of reception of the voltage oscillating signal by the bi-stable latch 40.

The number of configurations of the switching device 20, the oscillator 30 and the bi-stable latch 40 in accordance with the present invention is without limit. For example, the oscillator 30 and the bi-stable latch 40 may be separate devices, or partially or completely integrated devices. Also by example, the switching device may be partially or completely integrated within the oscillator 30, the bi-stable latch 40, or a partial/complete integration of the oscillator 30 and the bi-stable latch 40. Additionally, a communication of the voltage oscillating signal $V_{OS}$ by the oscillator 30 to the bi-stable latch 40 can be achieved in numerous ways (e.g., electrically, optically, acoustically, and/or magnetically). The number of embodiments of the PRNG 10 in accordance with the present invention is therefore essentially limitless.

The following description herein of five embodiments of PRNG 10 as illustrated in FIGS. 3–7 are premised on an operational specification directed to a common temperature dependence of the oscillator 30 and the bi-stable latch 40. Such common temperature dependence can be best achieved by employing standard library cells of the oscillator 30 and the bi-stable latch 40 on the same chip. Furthermore, short electrical coupling between the oscillator 30 and The bi-stable latch 40 prevents non-random signals to influence the random behavior of the bi-stable latch 40. The short electrical coupling can also be achieved by employing the oscillator 30 and the bi-stable latch 40 on the same chip.

Figure 3A:
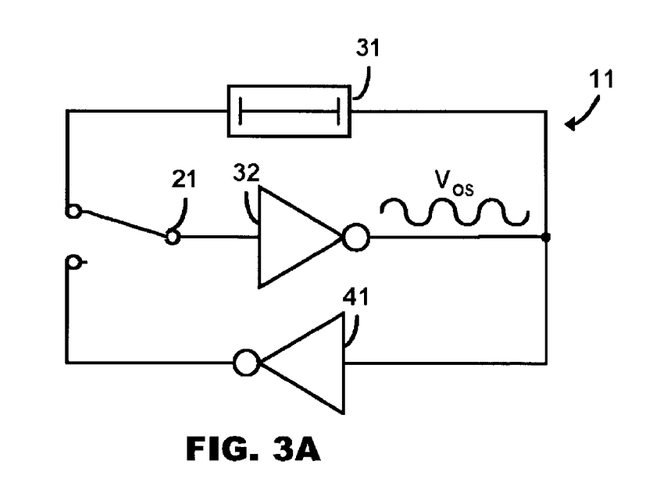
FIGS. 3A and 3B illustrate schematic diagrams of a first embodiment of a physical random number generator in accordance with the present invention.
Figure 3B:
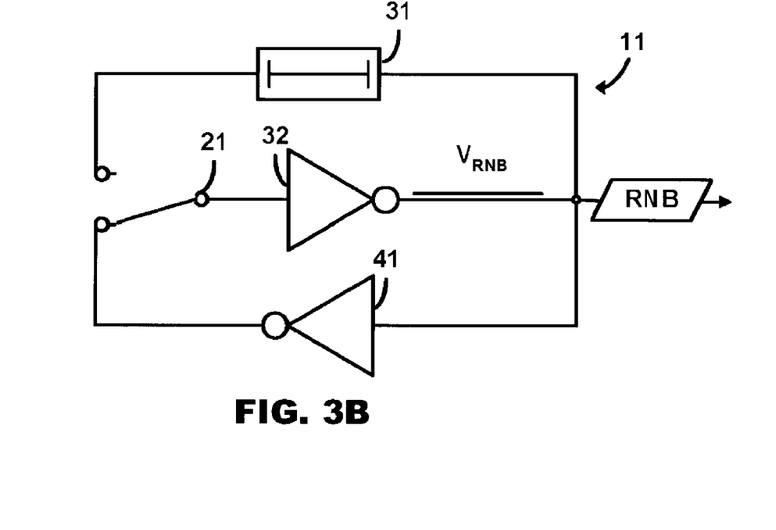

FIGS. 3A and 3B illustrate a physical random number generator 11 (hereinafter "PRNG 11") as one embodiment of PRNG 10 (FIG. 1). The PRNG 11 comprises a switching device in the form of an electronic switch 21 of a single pole/double throw switch variety (hereinafter "SPDT 21"), an oscillator in the form of a delay element 31 and an inverter 32, and a bi-stable latch in the form of the inverter 32 and an inverter 41. When SPD1 21 is in a first operating state as shown in FIG. 3A, an output of the inverter 41 is disconnected from the input of the inverter 32 (i.e., the bi-stable latch is deactivated), and the delay element 31 and the inverter 32 are activated to generate the voltage oscillating signal $V_{OS}$ for conditionally provoking the inverters 32 and 41 into a metastable state upon a connection of the output of the inverter 41 to the input of the inverter 32. When the SPDT 21 is in a second operating state as shown in FIG. 3B, an output of the delay element 31 is disconnected from the input of the inverter 32 (i.e., the oscillator is deactivated), and the inverters 32 and 41 are activated to receive the voltage oscillating signal $V_{OS}$ and to latch the random number bit RNB. If the bi-stable latch is provoked into a metastable state by the voltage oscillating signal $V_{OS}$, a logic voltage level $V_{RNB}$ of the random number bit RNB will reflect, after a delay, a stabilization of the unpredictable logic voltage level of the voltage oscillating signal $V_{OS}$ to a zero or an one. Otherwise, the logic voltage level $V_{RNB}$ of the random number bit RNB will follow the unpredictable logic voltage level of the voltage oscillating signal $V_{OS}$, which will either be a zero or a one. The transition of the SPDT 21 between the first operating state and the second operating state occurs at a frequency (fixed or variable) and a duty cycle (fixed or variable) in accordance with an operational specification for the frequency and the duty cycle of a generation of the random number bit RNB.

Figure 4A:
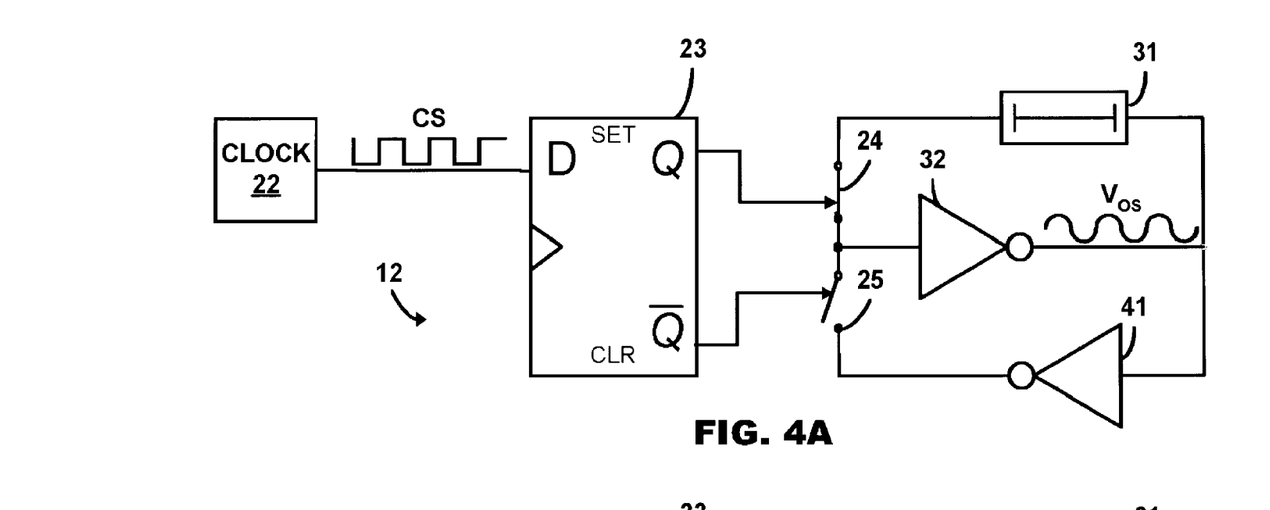
FIGS. 4A and 4B illustrate schematic diagrams of a second embodiment of a physical random number generator in accordance with the present invention.
Figure 4B:
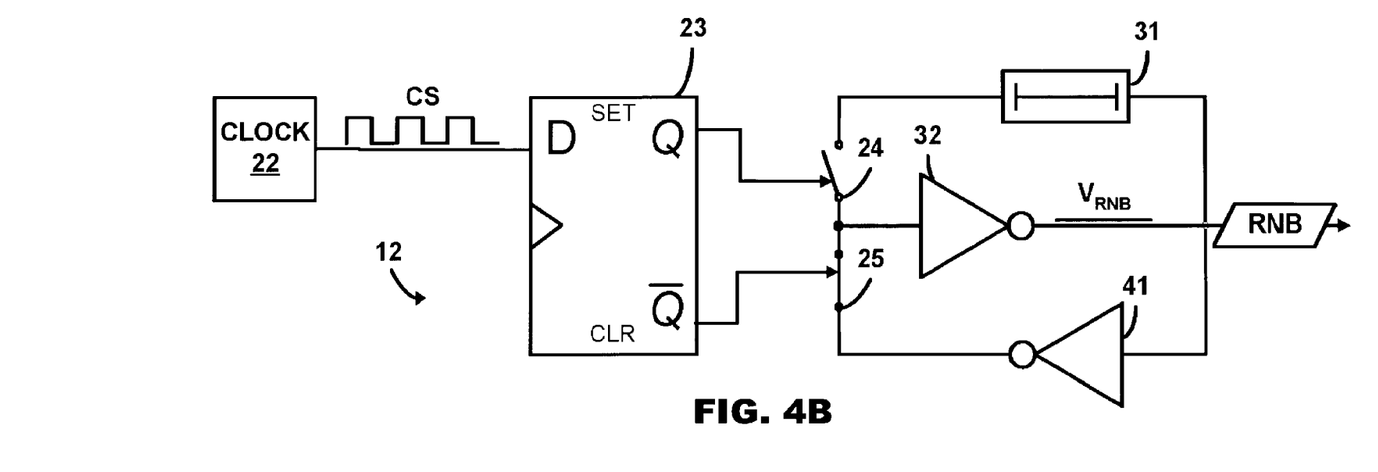

FIGS. 4A and 4B illustrate a physical random number generator 12 (hereinafter "PRNG 12") as another embodiment of PRNG 10 (FIG. 1). The PRNG 12 comprises a switching device in the form of a clock 22, a D-type flip-flop 23 (hereinafter "flip-flop 23"), and a pair of electronic switches 24 and 25 of a single pole/single throw variety (hereinafter "SPST 24" and "SPST 25")(e.g. bidirectional analog CMOS switches in the form of anti-parallel FETs). Other types of flip-flops can be substituted for flip-flop 23, and such substitutions can incorporate logic circuitry to create opposing outputs. The PRNG 12 further comprises the delay element 31, the inverter 32, and the inverter 41. Clock 22 and flip-flop 23 operate to cyclically transition SPST 24 and SPST 25 between an open position and a closed position in an opposing manner.

Specifically, the SPST 24 is in a closed position and SPST 25 is in an open position (i.e., the first operating state) in response to the clock signal CS being at a high logic voltage level (e.g., $V_{HL}$ of FIG. 1). When SPST 24 is in a closed position and SPST 25 is in an open position as shown in FIG. 4A, the output of the inverter 41 is disconnected from the input of the inverter 32 (i.e., the bi-stable latch is deactivated), and the delay element 31 and the inverter 32 are activated to generate the voltage oscillating signal $V_{OS}$ for conditionally provoking the inverters 32 and 41 into a metastable state upon an activation of bi-stable latch. Conversely, the SPST 24 is in an open position and SPST 25 is in a closed position (i.e., the second operating state) in response to the clock signal CS being at a low logic voltage level (e.g., $V_{LL}$ of FIG. 1). When SPST 24 is in the open position and SPST 25 is in the closed position as shown in FIG. 4B, the output of the delay element 31 is disconnected from the input of the inverter 32 (i.e., the oscillator is deactivated), and the inverters 32 and 41 are activated to receive the voltage oscillating signal $V_{OS}$ and to latch the random number bit RNB. If the bi-stable latch is provoked into a metastable state by the voltage oscillating signal $V_{OS}$, a logic voltage level $V_{RNB}$ of the random number bit RNB will reflect, after a delay, a stabilization of the unpredictable logic voltage level of the voltage oscillating signal $V_{OS}$ to a zero or an one. Otherwise, the logic voltage level $V_{RNB}$ of the random number bit RNB will follow the unpredictable logic voltage level of the voltage oscillating signal $V_{OS}$, which will either be a zero or a one. The respective opening and closing of SPST 24 and SPST 25 occurs at a frequency (fixed or variable) and a duty cycle (fixed or variable) of the clock signal CS, which is in accordance with an operational specification for the frequency and the duty cycle of a generation of the random number bit RNB.

Figure 5A:
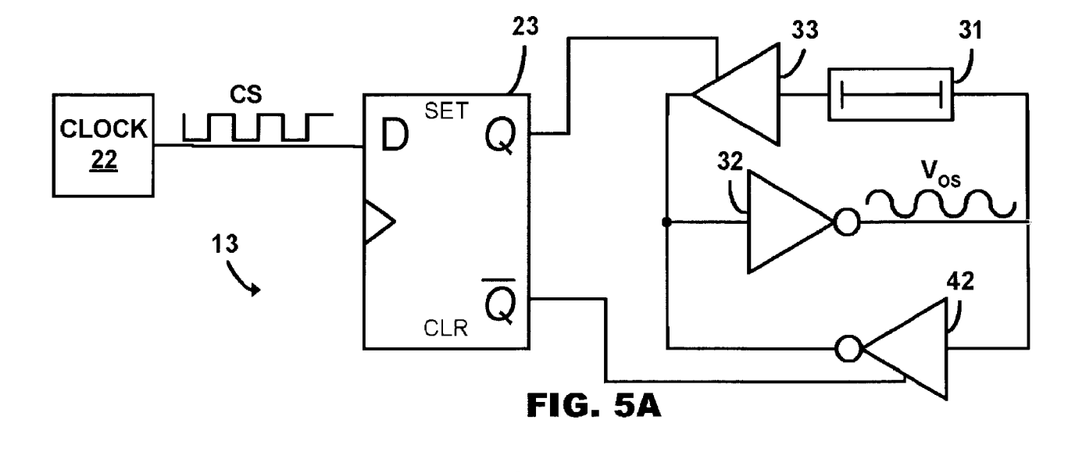
FIGS. 5A and 5B illustrate schematic diagrams of a third embodiment of a physical random number generator in accordance with the present invention.
Figure 5B:
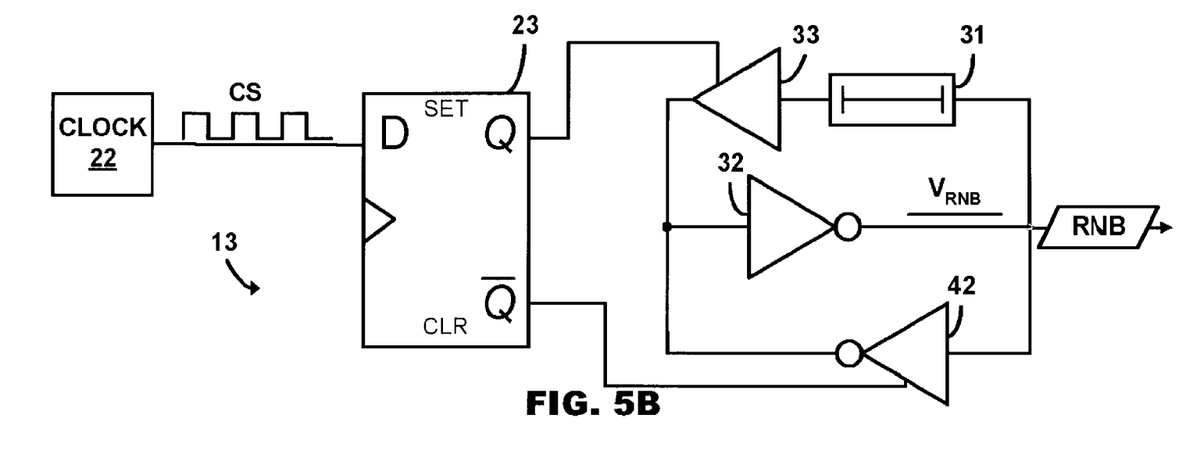

FIGS. 5A and 5B illustrate a physical random number generator 13 (hereinafter "PRNG 13") as another embodiment of PRNG 10 (FIG. 1). The PRNG 13 comprises a switching device in the form of the clock 22 and the flip-flop 23. Again, other types of flip-flops can be substituted for flip-flop 23, and such substitutions can incorporate logic circuitry to create opposing outputs. The PRNG 13 further comprises an oscillator in the form of the delay element 31, the inverter 32, and a tri-state buffer 33, and a bi-stable latch in the form of the inverter 32 and an inverter 42. Clock 22 and flip-flop 23 operate to cyclically transition buffer 33 and inverter 42 between an ON state and an OFF state, when their output is of high impedance, in an opposing manner.

Specifically, the buffer 33 is in an ON state and the inverter 42 is in an OFF state in response to the clock signal CS being at a high logic voltage level (e.g., $V_{HL}$ of FIG. 1). When buffer 33 is in the ON state and inverter 42 is in the OFF state as shown in FIG. 5A, the output of the inverter 42 is disconnected from the input of the inverter 32 (i.e., the bi-stable latch is deactivated), and the delay element 31, the inverter 32 and the buffer 33 are activated to generate the voltage oscillating signal $V_{OS}$ for conditionally provoking the inverters 32 and 42 into a metastable state upon an activation of the inverters 32 and 42. Conversely, the buffer 33 is in an OFF state and the inverter 42 is in an ON state in response to the clock signal CS being at a low logic voltage level (e.g., $V_{LL}$ of FIG. 1). When the buffer 33 is in the OFF state and inverter 42 is the ON state as shown in FIG. 5B, the output of the buffer 33 is disconnected from the input of the inverter 32 (i.e., the oscillator is deactivated), and the inverters 32 and 42 are activated to receive the voltage oscillating signal $V_{OS}$ and to latch the random number bit RNB. If the bi-stable latch is provoked into a metastable state by the voltage oscillating signal $V_{OS}$, a logic voltage level $V_{RNB}$ of the random number bit RNB will reflect, after a delay, a stabilization of the unpredictable logic voltage level of the voltage oscillating signal $V_{OS}$ to a zero or an one. Otherwise, the logic voltage level $V_{RNB}$ of the random number bit RNB will follow the unpredictable logic voltage level of the voltage oscillating signal $V_{OS}$, which will either be a zero or a one. The respective transition of the buffer 33 and the inverter 42 between the ON and OFF states occurs at a frequency (fixed or variable) and a duty cycle (fixed or variable) of the clock signal CS, which is in accordance with an operational specification for the frequency and the duty cycle of a generation of the random number bit RNB.

Figure 6A:
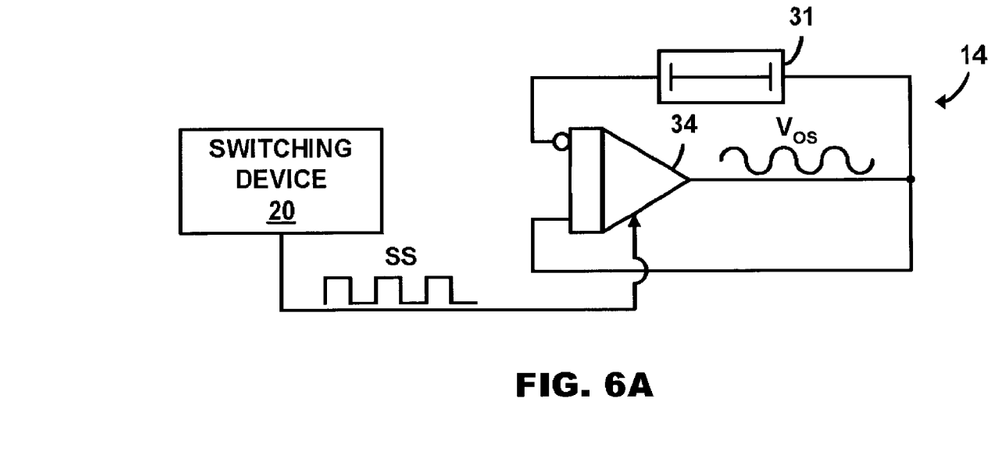
FIGS. 6A and 6B illustrate schematic diagrams of a fourth embodiment of a physical random number generator in accordance with the present invention.
Figure 6B:
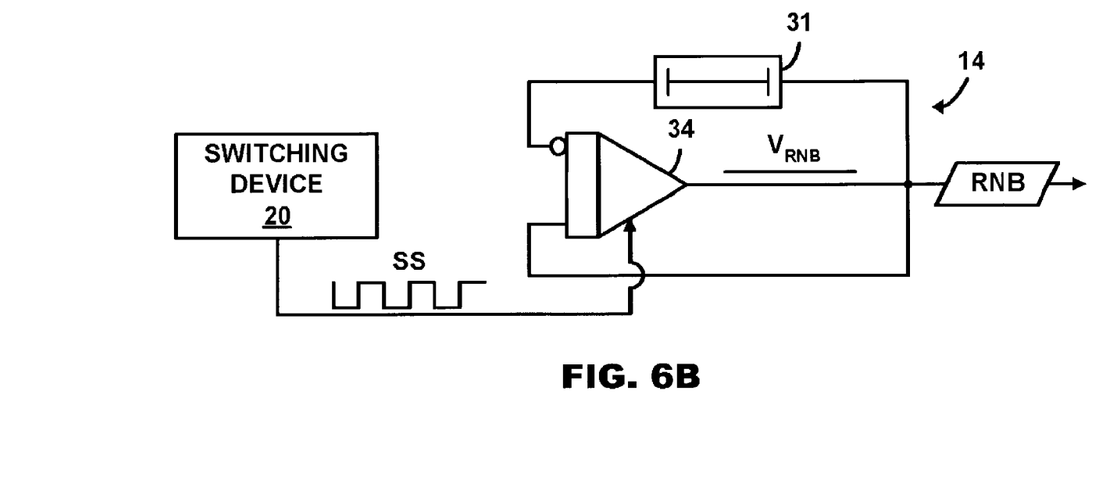

FIGS. 6A and 6B illustrate a physical random number generator 14 (hereinafter "PRNG 14") as another embodiment of PRNG 10 (FIG. 1). The PRNG 14 comprises the switching device 20, the delay element 31 and a multiplexer 34. The switching device 20 provides a switching signal SS to the multiplexer 34 for selecting either an illustrated inverting input of the multiplexer 34 to operate the delay element 31 and the multiplexer 34 as the oscillator (i.e., the first operating state) or an illustrated non-inverting input of the multiplexer 34 to operate the multiplexer 34 as the bi-stable latch (i.e., the second operating state). A frequency (fixed or variable) and a duty cycle (fixed or variable) of the switching signal SS is in accordance with an operational specification for the frequency and the duty cycle of a generation of the random number bit RNB.

When the inverting input of the multiplexer 34 is selected by the switching device 20 (i.e., the oscillator is activated and the bi-stable latch is deactivated), the negative feedback of the output of the multiplexer 34 through the delay element 31 to the inverting input of the multiplexer 34 forms a ring oscillator whereby the voltage oscillating signal $V_{OS}$ is generated as illustrated in FIG. 6A. When the non-inverting input of the multiplexer 34 is selected by the switching device 20 (i.e., the oscillator is deactivated and the bi-stable latch is activated), the feedback from the output of the multiplexer 34 to the non-inverting input of the multiplexer 34 forms a bi-stable latch whereby the random number bit RNB having a logic voltage level $V_{RNB}$ is latched as illustrated in FIG. 6B. At the time when the oscillator gets deactivated and the bi-stable latch is activated, the logic voltage level of the oscillator is unpredictable due to the phase noise and frequency drift resulted from the internal noise of the oscillator. When the unpredictable logic voltage level of voltage oscillating signal $V_{OS}$ is within the indeterminate range of the bi-stable latch, the bi-stable latch is provoked into a metastable state whereby the logic voltage level $V_{RNB}$ of the random number bit will stabilize after a delay to either a zero or a one. Otherwise, the logic voltage level $V_{RNB}$ will follow the unpredictable logic voltage level of the voltage oscillating signal $V_{OS}$ as a zero or a one. The resulting random number bit RNB is preferably read at the next switch change, when the bi-stable latch is deactivated and the ring oscillator is formed again with the delay element 31.

Figure 7A:
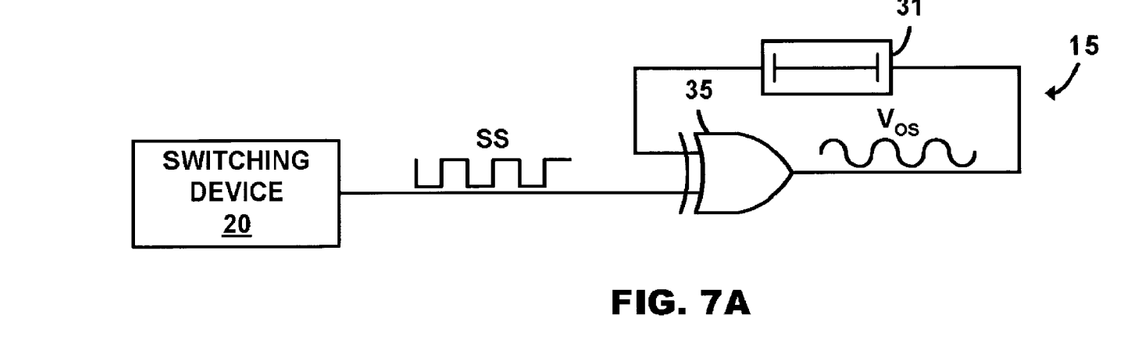
FIGS. 7A and 7B illustrate schematic diagrams of a fifth embodiment of a physical random number generator in accordance with the present invention.
Figure 7B:
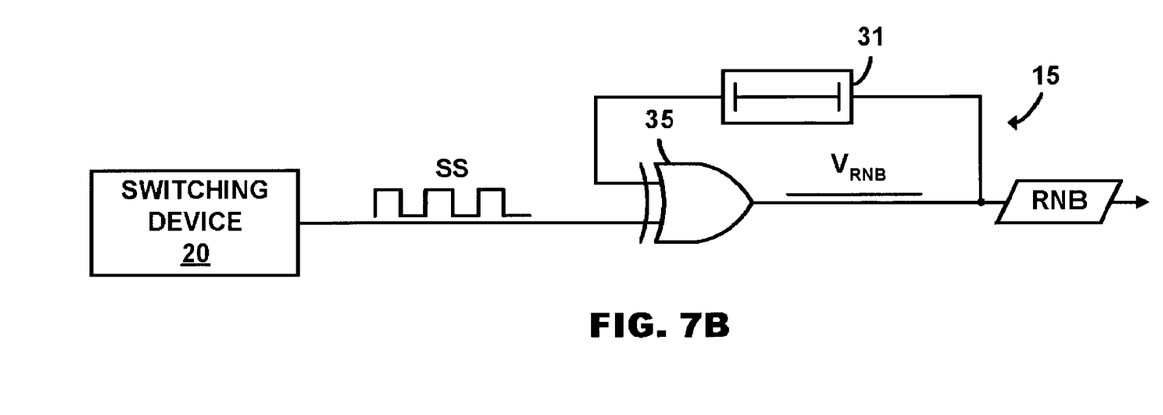

FIGS. 7A and 7B illustrate a physical random number generator 15 (hereinafter "PRNG 15") as another embodiment of PRNG 10 (FIG. 1). The PRNG 15 comprises the switching device 20, the delay element 31 and an XOR gate 35. The switching device 20 provides a switching signal SS to a first input of the XOR gate 35 at the high logic voltage level $V_{HL}$ (FIG. 1) to operate the delay element 31 and the XOR gate 35 as the oscillator (i.e., the first operating state) or at the low logic voltage level $V_{LL}$ (FIG. 1) to operate XOR gate 35 as the bi-stable latch (i.e., the second operating state). A frequency (fixed or variable) and a duty cycle (fixed or variable) of the switching signal SS is in accordance with an operational specification for the frequency and the duty cycle of a generation of the random number bit RNB.

When the switching signal is at the high logic voltage level $V_{HL}$, (i.e., the oscillator is activated and the bi-stable latch is deactivated), the feedback of the output of the XOR gate 35 through the delay element 31 to a second input of the XOR gate 35 forms a ring oscillator whereby the voltage oscillating signal $V_{OS}$ is generated as illustrated in FIG. 7A. When the non-inverting input of the XOR gate 35 is selected by the switching device 20 (i.e., the oscillator is deactivated and the bi-stable latch is activated), the feedback of the output of the XOR gate 35 through the delay element 31 to the second input of the XOR gate 35 forms a bi-stable latch whereby the random number bit RNB having a logic voltage level $V_{RNB}$ is latched as illustrated in FIG. 6B. At the time when the oscillator gets deactivated and the bi-stable latch is activated, the logic voltage level of the oscillator is unpredictable due to the phase noise and frequency drift resulted from the internal noise of the oscillator. When the unpredictable logic voltage level of voltage oscillating signal $V_{OS}$ is within the indeterminate range of the bi-stable latch, the bi-stable latch is provoked into a metastable state whereby the logic voltage level $V_{RNB}$ of the random number bit will stabilize after a delay to either a zero or a one. Otherwise, the logic voltage level $V_{RNB}$ will follow the unpredictable logic voltage level of the voltage oscillating signal $V_{OS}$ as a zero or a one. The resulting random number bit RNB is preferably read at the next switch change, when the bi-stable latch is deactivated and the ring oscillator is formed again with the delay element 31.

Figure 8:
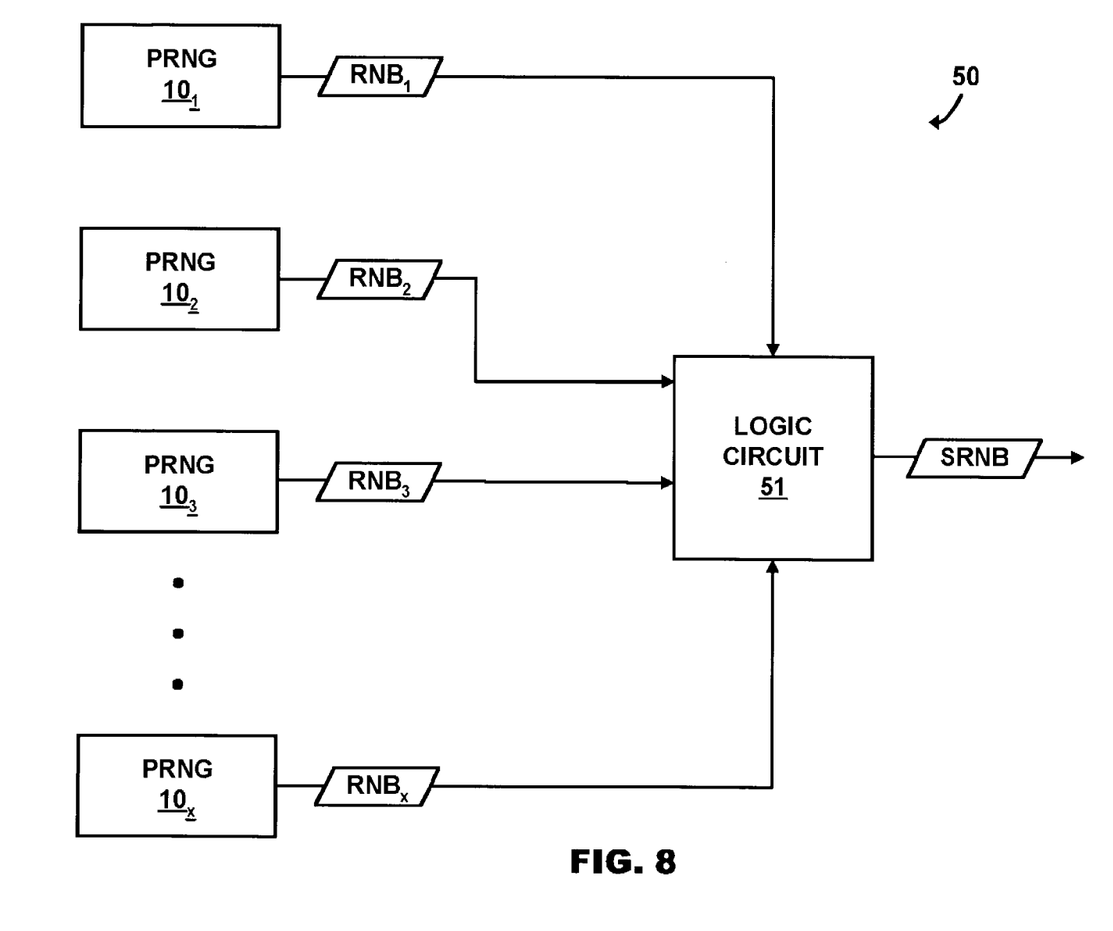
FIG. 8 illustrates a block diagram of a basic embodiment of a physical random number generation system in accordance with the present invention.

In practice, a PRNG 10 (FIG. 1) having an exactly matched temperature and supply voltage dependencies will rarely be achieved, if ever. Also, the manufacturing tolerances of the PRNG 10 can have imbalances whereby the PRNG 10 could generate the random number bit RNB as a zero significantly more often than producing the random number bit RNB as a one, or vice-versa. FIG. 8 illustrates a physical random number generating system 50 employing a plurality of PRNG $10_1$–$10_x$ electrically coupled to logic circuit 51 (e.g., a multi-input XOR gate) to thereby provide a plurality of random number bits $RNB_1$–$RNB_x$ to the logic circuit 51. In response thereto, the logic circuit 51 will provide a system random number bit SRNB that is sufficiently insensitive to any of the plurality of PRNG $10_1$–$10_x$ producing corresponding random number bits $RNB_1$–$RNB_x$ as a constant bit stream. As long as any one of the PRNG $10_1$–$10_x$ produces random bits, the resulting system random number bit SRNB will also be random. On a VLSI chip, integrating several hundreds of slightly different PRNG $10_x$ is feasible and the resulting bit stream will be highly unpredictable.

From the description of PRNGs 10–15, one skilled in the art will appreciate various benefits of the present invention. One benefit of the present invention is the facilitation of an easy implementation of a low power and relatively inexpensive physical random noise generator.

While the embodiments of the present invention disclosed herein are presently considered to be preferred, various changes and modifications can be made without departing from the spirit and scope of the present invention. The scope of the present invention is indicated in the appended claims, and all changes that come within the meaning and range of equivalents are intended to be embraced therein.

What is claimed is:

1. A physical random number generator, comprising:
    an oscillator operable to be selectively activated and deactivated; and
    a bi-stable latch operable to be selectively activated and deactivated,
        wherein, when said bi-stable latch is deactivated, said oscillator is activated to generate one or more voltage oscillating signals, each voltage oscillating signal having an unpredictable logic voltage level, and
        wherein, when said oscillator is deactivated, said bi-stable latch is activated to receive the one or more voltage oscillating signals and to latch a random number bit as a function of the unpredictable logic voltage level of each voltage oscillating signal at a time of the reception of the one or more voltage oscillating signals by said bi-stable latch.

2. The physical random number generator of claim 1, further comprising:
    a switching device operable to transition between a first operating state and a second operating state,
        wherein said bi-stable latch is deactivated and said oscillator is activated when said switching device is operating in the first operating state, and
        wherein said oscillator is deactivated and said bi-stable latch is activated when said switching device is operating in the second operating state.

3. The physical random number generator of claim 2,
    wherein said switching device includes an electronic switch operable to be transitioned between the first operating state and the second operating state, and
    wherein said oscillator includes a delay element and an inverter operable to be concurrently activated when said electronic switch is operating in the first operating state.

4. The physical random number generator of claim 2,
    wherein said switching device includes an electronic switch operable to be transitioned between the first operating state and the second operating state, and
    wherein said bi-stable latch includes a first inverter and a second inverter operable to be concurrently activated when said electronic switch is operating in the second operating state.

5. The physical random number generator of claim 2, wherein said switching device includes:
    a first electronic switch operable to closed in the first operating state and opened in the second operating state;
    a second electronic switch to be opened in the first operating state and closed in the second operating state;
    a clock operable to provide a clock signal; and
    a flip-flop operable to close and open said first electronic switch and said second electronic switch in an alternating manner in response to the clock signal.

6. The physical random number generator of claim 5, wherein said oscillator includes
    a delay element, and
    an inverter operable to be concurrently activated when said first electronic switch is closed.

7. The physical random number generator of claim 5, wherein said bi-stable latch includes
    a first inverter, and
    a second inverter operable to be concurrently activated when said second electronic switch is closed.

8. The physical random number generator of claim 2,
    wherein said oscillator includes a delay element, an inverter and a buffer; and
    wherein said switching device includes
        a clock operable to provide a clock signal, and
        a flip-flop operable to collectively activate said delay element, said inverter, and said buffer in response to the clock signal having a voltage level representative of the first operating state.

9. The physical random number generator of claim 2,
    wherein said bi-stable latch includes a first inverter and a second inverter, and
    wherein said switching device includes
        a clock operable to provide a clock signal, and
        a flip-flop operable to collectively activate said first inverter and said second inverter in response to the clock signal having a voltage level representative of the second operating state.

10. The physical random number generator of claim 1, wherein said oscillator includes
    a multiplexer, and
    a delay element operable to provide feedback from an output of the multiplexer to an inverting input of the multiplexer.

11. The physical random number generator of claim 1, wherein said bi-stable latch includes a multiplexer operable to provide a feedback from an output of the multiplexer to a non-inverting input of the multiplexer.

12. The physical random number generator of claim 1, wherein said oscillator includes
    an XOR gate, and
    a delay element operable to provide feedback from an output of said XOR gate to an input of said XOR gate.

13. The physical random number generator of claim 1, wherein said bi-stable latch includes
    an XOR gate, and
    a delay element operable to provide feedback from an output of said XOR gate to an input of said XOR gate.

14. A physical random number generating system, comprising:
    a plurality of random number generators operable to provide a plurality of random number bits;
    a logic circuit operable to provide a system random number bit in response to a reception of the plurality of random number bits; and
    wherein a first random number generator includes
        an oscillator operable to be selectively activated and deactivated, and
        a bi-stable latch operable to be selectively activated and deactivated,
            wherein, when said bi-stable latch is deactivated, said oscillator is activated to generate one or more voltage oscillating signals, each voltage oscillating signal having an unpredictable logic voltage level, and wherein, when said oscillator is deactivated, said bi-stable latch is activated to receive the one or more voltage oscillating signals and to latch a random number bit as a function of the unpredictable logic voltage level of each voltage oscillating signal at a time of the reception of the one or more voltage oscillating signals by said bi-stable latch.

15. The physical random number generating system of claim 14, wherein said first random number generator further includes a switching device operable to transition between a first operating state and a second operating state,
wherein said bi-stable latch is deactivated and said oscillator is activated when said switching device is operating in the first operating state, and
wherein said oscillator is deactivated and said bi-stable latch is activated when said switching device is operating in the second operating state.

16. The physical random number generating system of claim 15, wherein said switching device includes an electronic switch operable to be transitioned between the first operating state and the second operating state, and
wherein said oscillator includes a delay element and an inverter operable to be concurrently activated when said electronic switch is operating in the first operating state.

17. The physical random number generating system of claim 15, wherein said switching device includes an electronic switch operable to be transitioned between the first operating state and the second operating state, and
wherein said bi-stable latch includes a first inverter and a second inverter operable to be concurrently activated when said electronic switch is operating in the second operating state.

18. The physical random number generating system of claim 15, wherein said switching device includes:

a first electronic switch operable to closed in the first operating state and opened in the second operating state;
a second electronic switch to be opened in the first operating state and closed in the second operating state;
a clock operable to provide a clock signal; and
a flip-flop operable to close and open said first electronic switch and said second electronic switch in an alternating manner in response to the clock signal.

19. The physical random number generating system of claim 18, wherein said oscillator includes a delay element, and
an inverter operable to be concurrently activated when said first electronic switch is closed.

20. The physical random number generating system of claim 18, wherein said bi-stable latch includes a first inverter, and
a second inverter operable to be concurrently activated when said second electronic switch is closed.

21. The physical random number generating system of claim 15, wherein said oscillator includes a delay element, an inverter and a buffer; and
wherein said switching device includes
a clock operable to provide a clock signal, and
a flip-flop operable to collectively activate said delay element, said inverter, and said buffer in response to the clock signal having a voltage level representative of the first operating state.

22. The physical random number generating system of claim 15, wherein said bi-stable latch includes a first inverter and a second inverter; and
wherein said switching device includes
a clock operable to provide a clock signal, and
a flip-flop operable to collectively activate said first inverter and said second inverter in response to the clock signal having a voltage level representative of the second operating state.

23. The physical random number generating system of claim 14, wherein said oscillator includes a multiplexer, and
a delay element operable to provide feedback from an output of the multiplexer to an inverting input of the multiplexer.

24. The physical random number generating system of claim 14, wherein said bi-stable latch includes a multiplexer operable to provide a feedback from an output of the multiplexer to a non-inverting input of the multiplexer.

25. The physical random number generating system of claim 14, wherein said oscillator includes an XOR gate, and
a delay element operable to provide feedback from an output of said XOR gate to an input of said XOR gate.

26. The physical random number generating system of claim 14, wherein said bi-stable latch includes an XOR gate, and
a delay element operable to provide feedback from an output of said XOR gate to an input of said XOR gate.

27. A physical random number generator transitional between a first operating state and a second operating state, comprising:

means for generating one or more voltage oscillating signals during the first operating state of said physical random number generator, each voltage oscillating signal having an unpredictable logic voltage level; and
means for latching a random number bit during the second operating state of said physical random number generator, the random number bit being a function of the unpredictable logic voltage level of each voltage oscillating signal.

* * * * *